(12) United States Patent
Zhou (10) Patent No.: US 6,998,721 B2
(45) Date of Patent: Feb. 14, 2006

(54) STACKING AND ENCAPSULATION OF MULTIPLE INTERCONNECTED INTEGRATED CIRCUITS

(75) Inventor: Tiao Zhou, Irving, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 69 days.

(21) Appl. No.: 10/291,263

(22) Filed: Nov. 8, 2002

(65) Prior Publication Data

US 2004/0089955 A1    May 13, 2004

(51) Int. Cl.
*H01L 23/06*    (2006.01)
*H01L 29/40*    (2006.01)
*H01L 23/50*    (2006.01)

(52) U.S. Cl. ............... 257/790; 257/686; 257/685; 257/723; 257/87; 257/777; 257/724; 257/725; 257/728; 257/680; 257/679; 257/787; 257/788; 382/103; 382/154; 382/161; 713/169; 713/193; 713/168

(58) Field of Classification Search .......... 257/790, 257/788, 787, 777, 686, 685, 723, 691, 730, 257/773, 724, 725, 728, 680, 679; 382/103, 382/154, 161; 713/169, 193, 168
See application file for complete search history.

(56) References Cited

U.S. PATENT DOCUMENTS

| | | | |
|---|---|---|---|
| 4,532,419 A * | 7/1985 | Takeda ................ 235/492 |
| 5,546,297 A | 8/1996 | Duley ................ 363/62 |
| 5,693,572 A | 12/1997 | Bond et al. ................ 437/209 |
| 5,711,069 A | 1/1998 | Hundt ................ 29/890.03 |
| 5,805,419 A | 9/1998 | Hundt et al. ................ 361/719 |
| 5,991,156 A | 11/1999 | Bond et al. ................ 361/707 |
| 5,994,774 A | 11/1999 | Siegel et al. ................ 257/727 |
| 6,028,773 A | 2/2000 | Hundt ................ 361/760 |
| 6,113,399 A | 9/2000 | Hundt et al. ................ 439/70 |
| 6,184,658 B1 * | 2/2001 | Mori et al. ................ 320/134 |
| 6,313,521 B1 * | 11/2001 | Baba ................ 257/678 |
| 6,316,840 B1 * | 11/2001 | Otani ................ 257/787 |
| 6,339,255 B1 * | 1/2002 | Shin ................ 257/686 |
| 6,433,418 B1 | 8/2002 | Fujisawa et al. ................ 257/696 |
| 6,444,501 B1 * | 9/2002 | Bolken ................ 438/127 |
| 6,583,512 B1 * | 6/2003 | Nakaoka et al. ................ 257/777 |
| 6,607,937 B1 * | 8/2003 | Corisis ................ 438/108 |
| 6,700,190 B1 * | 3/2004 | Siegel et al. ................ 257/684 |
| 6,706,565 B1 * | 3/2004 | Brand ................ 438/126 |
| 6,747,361 B1 * | 6/2004 | Ichinose ................ 257/784 |
| 2001/0019181 A1 | 9/2001 | Lee et al. ................ 257/796 |
| 2002/0113325 A1 | 8/2002 | Kim ................ 257/787 |
| 2002/0140085 A1 | 10/2002 | Lee et al. ................ 257/724 |

FOREIGN PATENT DOCUMENTS

EP    1 143 519 A2    10/2001

* cited by examiner

*Primary Examiner*—Alexander Oscar Williams
(74) *Attorney, Agent, or Firm*—David V. Carlson; Lisa K. Jorgenson (57) ABSTRACT

In one embodiment, a device includes but is not limited to: a first integrated circuit affixed to a substrate; an electronic circuit component affixed to the substrate; a first encapsulation structure encasing the first integrated circuit; a second integrated circuit affixed to the first encapsulation structure; and a second encapsulation structure which at least partially encases the first encapsulation structure, the first integrated circuit, and the electronic component.

20 Claims, 7 Drawing Sheets

MULTI-LEVEL DIE OPEN FACE PACKAGE STRUCTURE

*Fig. 2B*
1ST PASS ENCAPSULATION

*Fig. 2C*
2ND PASS ENCAPSULATION

Fig. 3A

DIE ATTATCH GLUE DISPENSING

STACKING AND ENCAPSULATION OF MULTIPLE INTERCONNECTED INTEGRATED CIRCUITS

BACKGROUND OF THE APPLICATION

1. Field of the Application

The present application pertains to packaged integrated circuits

2. Description of the Related Art

Integrated circuits are typically housed in hermetic packages, such as ceramic cavity packages, or plastic packages (jointly referred to hereinafter as "integrated circuit packages"). In some integrated circuit applications, it has been found advantageous to stack two or more integrated circuit packages.

In one method, integrated circuit packages are stacked by affixing one to a printed circuit board, and thereafter a second or more integrated circuit packages are stacked atop the first integrated circuit package; see, for example, U.S. Pat. No. 5,546,297 to Duley. Another method is to use either side of a two sided printed circuit board, wherein one or more integrated circuits or circuit elements are formed on a top side of the printed circuit board, and wherein one or more integrated circuits or circuit elements are formed on a bottom side of the printed circuit board One example of an application using the top and the bottom of a printed circuit board is described in the herein incorporated by reference in its entirety U.S. Pat. No. 6,028,773 (22 Feb. 2000), entitled Packaging for Silicon Sensors, naming Michael J. Hundt as inventor (hereinafter the "Hundt '773 patent").

BRIEF DESCRIPTION OF THE SEVERAL VIEWS OF THE DRAWINGS

The use of the same symbols in different drawings typically indicates similar or identical items.

DETAILED DESCRIPTION

Figure 1:
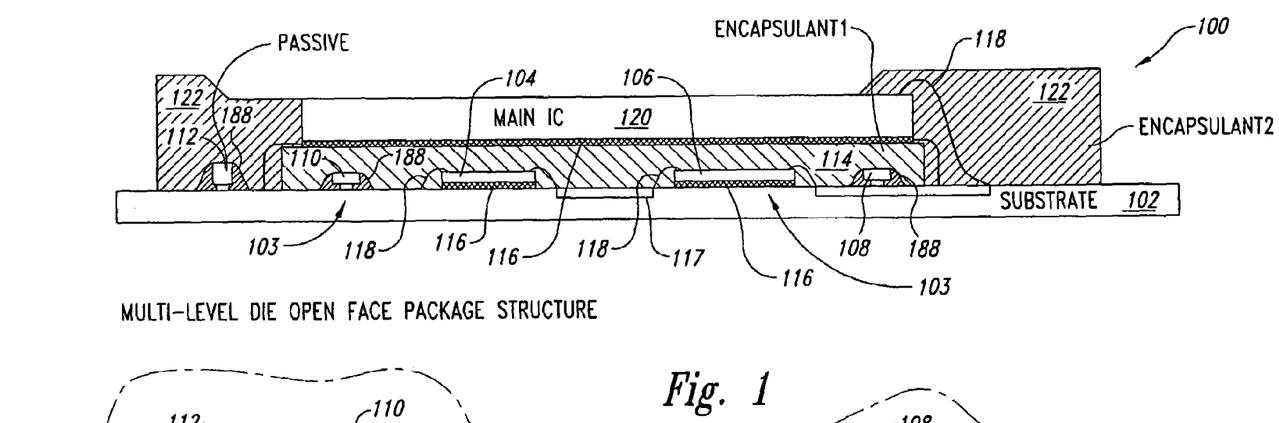
FIG. 1 shows a side-plan view of device 100.

FIG. 1 shows a side-plan view of device 100. Substrate 102 has various electronic components 103, integrated circuits 104, 106 and passive circuit elements 108, 110, and 112 affixed to it. Positioning of the integrated circuits and passive circuits elements is merely an example, and the various semiconductor devices can be moved about as needed by the designer. For example, passive circuit element 112 could be an integrated circuit, and the same is true for virtually all integrated circuits and passive circuit elements shown in FIG. 1.

Substrate 102 is a printed circuit board in one embodiment, or alternatively can be a semiconductor substrate or semiconductor package substrate. Substrate 102 preferably has electrically conductive lines 117 formed therein for connecting together selected ones of the electrical pads of integrated circuits 104, 106 to each other and to passive circuit components 108, 110, and 112. Examples of integrated circuits 104, 106 are oscillators, voltage regulators, microprocessors, memory devices, etc. Examples of passive circuit elements 108, 110, 112 are resistors, capacitors, and inductors. The various electrical components 103 can be any acceptable electronic circuits and passive elements at any of the locations shown herein or at other locations on substrate 102. Die attach adhesive 116 can be conductive, or non-conductive, epoxy glues. Conductive adhesives are often utilized if the system designer desires to ground the back of a particular integrated circuit, while non-conductive adhesives are often used when grounding is not a concern or when electric isolation is desired. The use of either conductive or non-conductive epoxy glues is a design choice dependent upon application.

Encapsulation structure 114 encases integrated circuits 104, 106 and passive circuit elements 108, 110 mounted on substrate 102. In some embodiments, an electronic circuit element 112 mounted on substrate 102 is not encased within encapsulation structure 114. Further, in some embodiments, only a single, integrated circuit 104 is under the encapsulant 114 and connected to substrate 102. The integrated circuits are connected with bonding wires 118 to various electrical trace conductors 117 in substrate 102. Electronic circuit element 112 may be taller than the other components, positioned at a spaced apart location or be connected and bonded at a separate time such that it is preferred to not enclose it in first encapsulant 114. It is common that capacitors have a different profile than integrated circuits. It is thus desirable, in some embodiments, to have the capacitor encapsulated in a separate structure than the encapsulation for the integrated circuits 104 and 106. In one embodiment, such an additional component 112 is not present and all the circuits are enclosed within the first encapsulant 114.

Substrate 102 has a plurality of electrically conductive lines 117 in the form of electrical traces therein. The electrical traces are formed within substrate 102 by conventional methods. Some of electrical traces 117 connect integrated circuits 104 and 106 to each other which are completely enclosed within first encapsulant 114. Other of traces 117 electrically connect bonding wires 118 of main integrated circuit 120 to the electrical components underneath the first encapsulant, such as to integrated circuits 106 and 104. Only a few of conductive traces 117 are shown to illustrate examples of the location and connection of such conductive traces for coupling the integrated circuits to each other and it will be understood that there are many conductive traces 117 electrically connecting the integrated circuits 104 and 106 to each other as well as connecting main integrated circuit 120 to various of the components underneath first encapsulant 114. Since the electrical connections are made within printed circuit board 102, a large number of electrical connections can be made reliably even though the first set of integrated circuits 104 and 106 are encased within the encapsulant 114.

Main integrated circuit 120 is affixed to encapsulation structure 114. In one implementation, main integrated circuit 120 is attached via die attach adhesive 116. Examples of main integrated circuit 120 are fingerprint-sensor integrated circuits, such as that described in the Hundt '773 patent, and smart card integrated circuits. As is known smart cards are about the size of a credit card, and contain embedded integrated circuits, where the integrated circuits are often used to store and communicate personal medical, financial, or other information.

Encapsulation structure 122 at least partially encases main integrated circuit 120, and encapsulation structure 114. In one embodiment, it also encases passive circuit element 112. An encapsulation structure 122, which partially encases main integrated circuit 120, is particularly useful when at least one surface of integrated circuit 120 is preferably exposed. Examples of such integrated circuits having one surface exposed are described in the Hundt '773 patent, and include fingerprint-sensor integrated circuits, as well as silicon sensors which have been developed to sense chemicals, vibrations from sound, radiation from light and color images, as well as temperature and pressure. Those skilled in the art will further appreciate that, in other implementations, encapsulation structure 122 completely encases main integrated circuit 120 as well as encapsulation structure 114. Completely encapsulating main integrated circuit 120 is useful when a complete seal is desired, such as in smart cards. Alternatively, encapsulant 122 may fully encase encapsulation structure 114, but only partially encase circuit 112.

The combination of integrated circuits 104 and 106 under a first encapsulant and placing a chip on top of them which is also encapsulated is useful in memory applications of secure data. This combination encapsulation structure 122 is particularly useful to provide increased data security. There is no open connection available that a probe could contact to obtain a signal that is transmitted from any of the integrated circuits to other integrated circuits in the package. The data stream cannot be accessed without destruction of either or both encapsulation structure 122 and encapsulation structure 114. By encapsulating all the circuit components as shown and described, the security system is significantly enhanced. Additionally, if a pirate attempts to dissolve encapsulation structure 122 and encapsulation structure 114, such an operation will destroy the electrical connections and substrate 102 holding bonding wires 118, and the original routing of the signals cannot be determined. This provides a further security measure in the event of would-be pirate attempts to circumvent the system in order to access the lines.

A further advantage of the combination of the present subject matter is the considerable space savings to provide a large number of integrated circuits in a very small space. By stacking integrated circuits, one on top of the other and having a relatively thin encapsulant in between, high density of the packing on a single substrate 102 is achieved.

Encapsulant 114 is any acceptable encapsulant which provides electrical insulation and sufficient protection for integrated circuits 104 and 106. Generally, a very thin encapsulant 114 is used so that the overall profile of the package remains quite low. For example, a simple epoxy resin combination may be used or other material which easily flows around the integrated circuits and has a low profile so as to provide sufficient electrical insulation and protection without adding substantially to the thickness of the overall package. In many embodiments, encapsulant 114 will have a total thickness just slightly greater than the integrated circuits themselves.

Figure 2A:
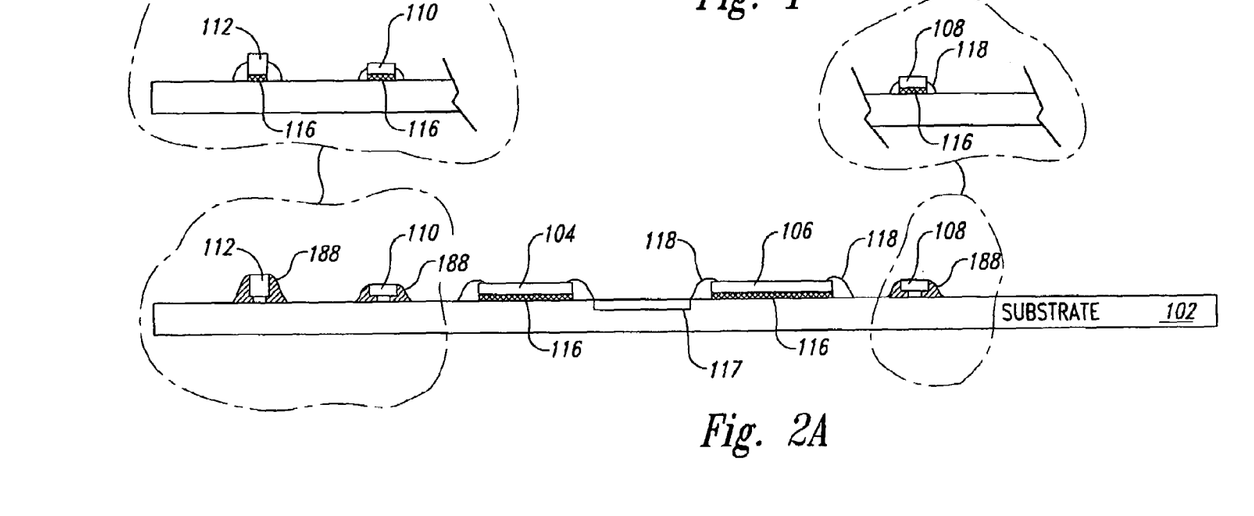
FIGS. 2A–C depict one implementation of a process for forming device 100 of FIG. 1.

Referring now to FIGS. 2A–C, depicted is one implementation of a process for making device 100 of FIG. 1. As shown in the exploded portion of FIG. 2A, integrated circuits 104 and 106 are attached to substrate 102 via die attach adhesive 116 (the die adhesive is not shown to scale), and the passive circuit elements 108, 110, and 112 are attached to substrate 102 via solder or conductive adhesive 188. As mentioned above, in an alternative embodiment passive circuit element 112 could be an integrated circuit; consequently, shown in the non-exploded portion of FIG. 2A is that in another embodiment what are depicted as passive circuit elements 108, 110, 112 are attached to substrate 102 via die attach adhesive 116. Bonding wires 118 are connected to the bonding pads of the integrated circuits 104 and 106 and to the appropriate pads on substrate 102. As previously explained, substrate 102 includes a plurality of conductive traces 117 which provide electrical connections between integrated circuits 104,106 as well as passive components 108, 110, and 112. The structure of FIG. 2A can be made using any conventional technique or methods known in the art, any of which are acceptable for use with this invention.

Figure 2B:
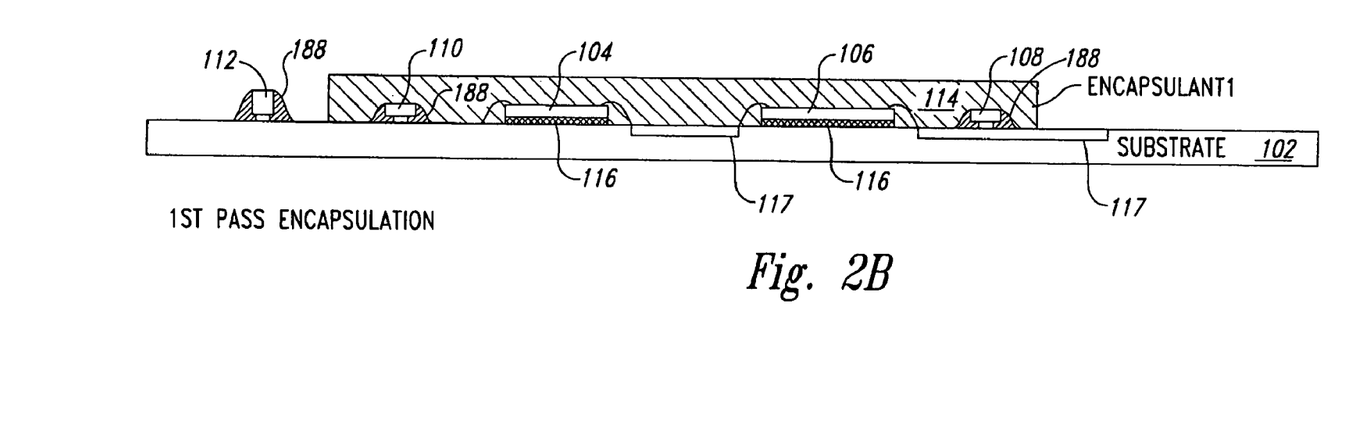

As shown in FIG. 2B, encapsulation structure 114 is formed to encase the components on substrate 102. In one embodiment, encapsulation structure 114 is formed to encompass only a part of the integrated circuits and passive circuit elements positioned on substrate 102. Specifically, encapsulation structure 114 has been formed to encase only integrated circuits 104, 106 and passive circuit elements 108, 110 mounted on substrate 102. In some embodiments, all circuits on substrate 102 will be encapsulated, while in others, only a single integrated circuit 104 is encased.

Figure 2C:
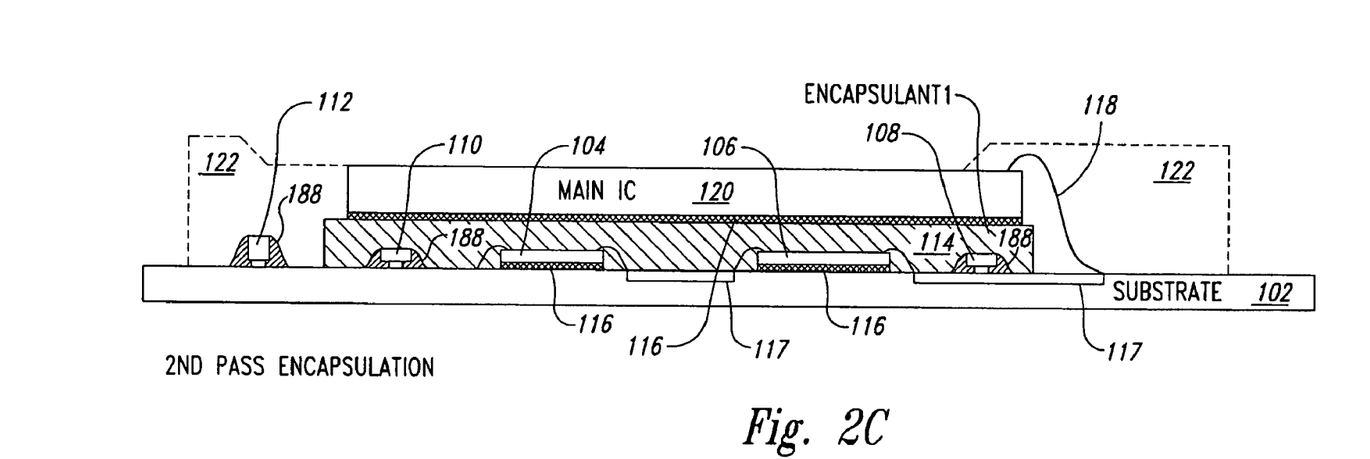

With reference now to FIG. 2C, main integrated circuit 120 has been affixed to encapsulation structure 114 via die attach adhesive 116. Bonding wires 118 are formed which connect main integrated circuit 120 with conductive structures 117 of substrate 102. Illustrated, via use of dashed lines, is that subsequent to placing main integrated circuit 120 on encapsulant 114, encapsulation structure 122 is to be formed such that encapsulation structure 122 at least partially encases main integrated circuit 120 and encases, either partially or fully, encapsulation structure 114 and passive circuit element 112. In another implementation, encapsulation structure 122 is formed such that that encapsulation structure 122 completely encases main integrated circuit 120 as well. The structure is completed to form the device as shown in FIG. 1.

Figure 3A:
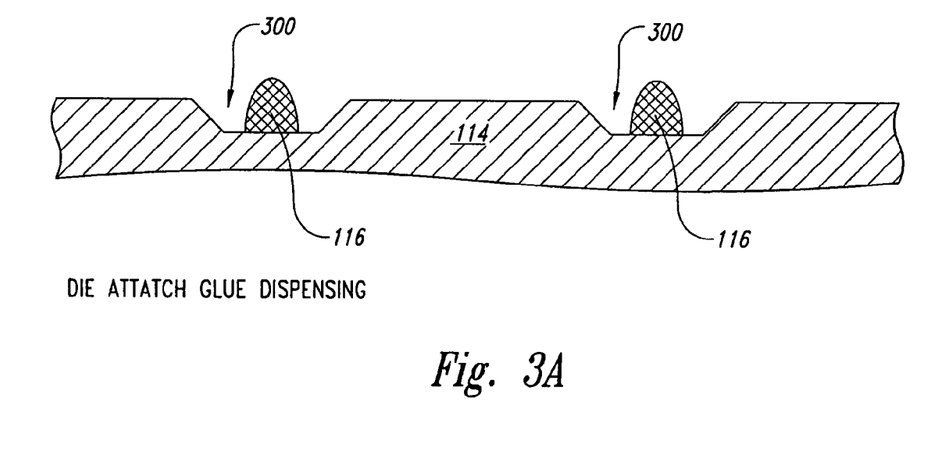
FIGS. 3A–3B illustrate an alternate implementation of the process step described in relation to FIG. 2B.

With reference now to FIG. 3A, an alternate encapsulation structure 114 has grooves 300 formed therein, which are thereafter filled with die adhesive 116. The grooves may be formed by any acceptable technique, such as having an embossed feature on a mold, or etching, cutting, or milling.

Figure 3B:
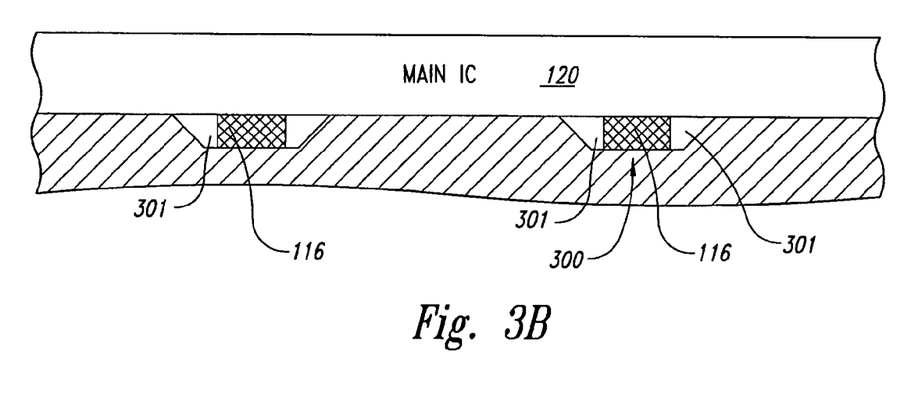

As shown in FIG. 3B, subsequent to die adhesive 116 being placed in grooves 300, main integrated circuit 120 is placed in contact with die adhesive 116 and encapsulation structure 114. The amount of die adhesive 116 should be of a volume that when placed within grooves 300, and having the main integrated circuit 120 placed thereon, die adhesive 116 remains substantially within the confines of encapsulation structure 114. An open space 301 remains on either side of groove 300. The volume of die adhesive 116 is selected to ensure that it does not completely fill the grooves and leaves void region 301. This ensures that main integrated circuit 120 will be connected substantially flat against first encapsulant 114 and there will be no uneven surfaces based on the thickness of die adhesive 116.

The alternate implementations shown in FIGS. 3A and 3B result in no substantial die tilt of main integrated circuit 120 relative to encapsulation structure 114, because the orientation of main integrated circuit 120 is referenced relative to the upper surface of encapsulation structure 114. Referencing main integrated circuit 120 relative to a surface of encapsulation structure 114 will tend to make the resulting package construction more robust.

Figure 4A:
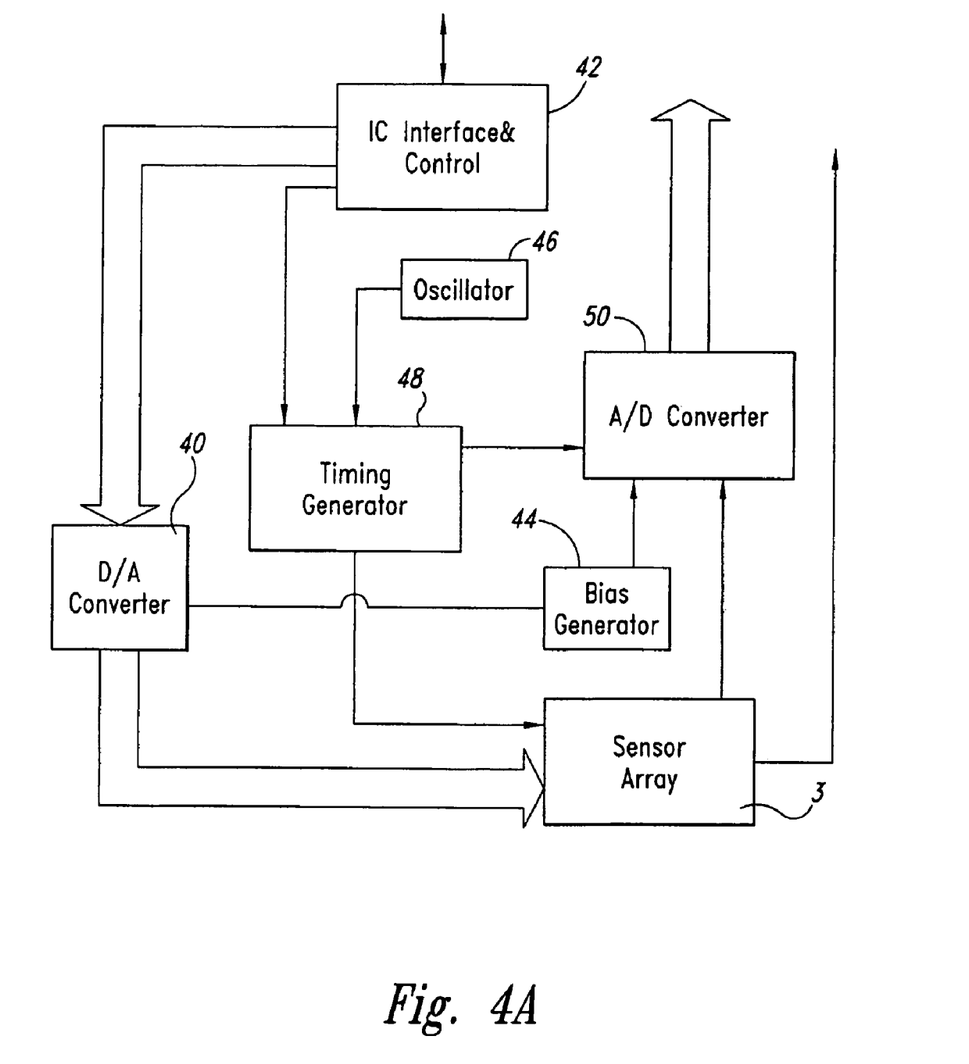
FIGS. 4A and 4B show examples of data processing systems into which the herein described devices may be incorporated.

FIG. 4A illustrates circuits positioned on substrate 102, including an IC interface and control circuit 42. Main integrated circuit 120 may include a sensor array 3. The sensor array 3 may be of the type which is sensitive to fingerprint data and outputs a signal corresponding to the fingerprints positioned thereon. The other circuit portions shown in FIG. 4A may be formed on one or more integrated circuits 104 and 106. For example, D/A converter 40, timing generator 48, and bias generator 44 may be formed on integrated circuit 104. An integrated circuit interface and control, together with the appropriate D/A converter 50 and oscillator 46 may be formed on integrated circuit 106. Alternatively, all these circuits may be formed on a single integrated circuit 104, so that circuit 106 is not needed, or circuit 106 may be a memory.

Figure 4B:
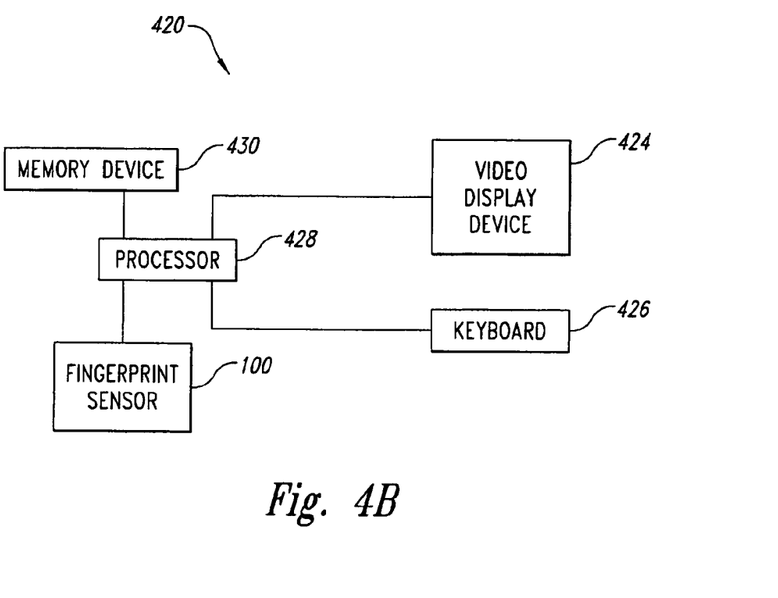

FIG. 4B shows an example representation of data processing system 420 with which at least a part of device 100 may be incorporated. Specifically, depicted is device 100 (one example of which is a fingerprint sensor) integrated into data processing system 420. Data processing system 420 may include video display device 424, keyboard 426, processor 428, and memory device 430. Data processing system 420 may also have other common data processing system components, depending on the particular application of the system. Data processing system 420 may be implemented utilizing any suitable commercially available data processing components or commercially available computer systems, where such suitability is dependent upon the application and is a design choice within the purview of the system designer. Lastly, graphical user interface systems (e.g., Microsoft Windows 98 or Microsoft Windows NT operating systems) and methods can be utilized with the data processing system depicted in FIG. 4B and described elsewhere herein. In some implementations, device 100 actually controls access to data processing systems. Examples of such commercially available computer systems include personal, mini, workstation, and mainframe computer systems. In other implementations, such as those described following, device 100 is integrated into data processing systems which help control access to other items, such as buildings, vehicles, and firearms.

Figure 5:
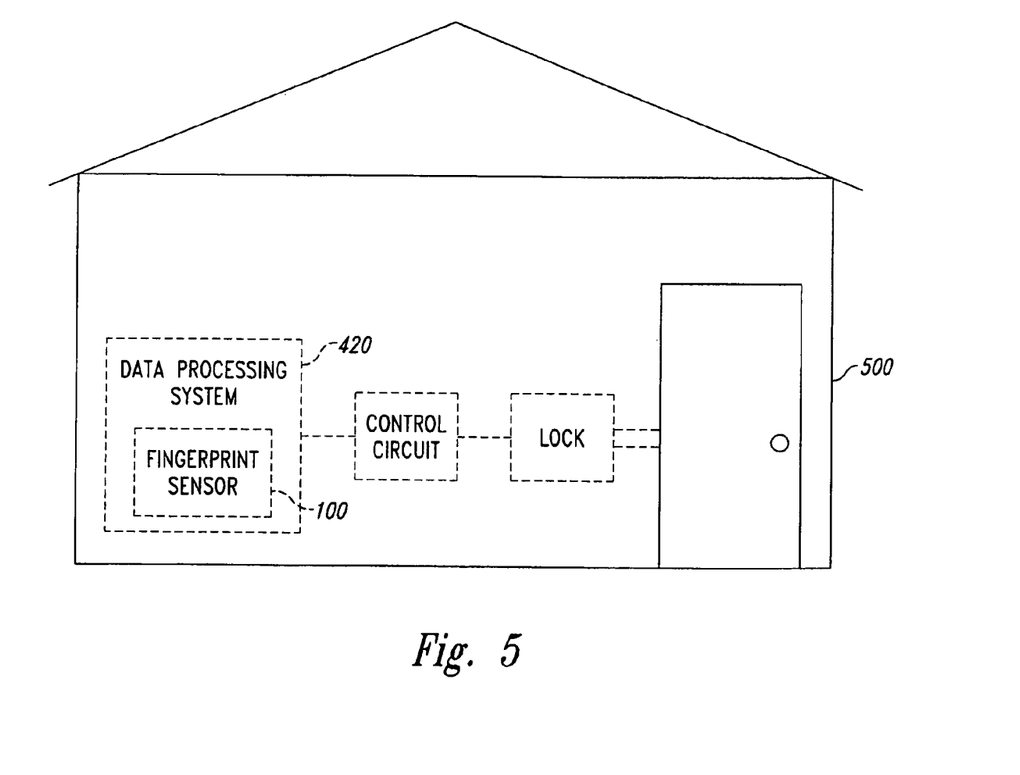
FIG. 5 depicts an example representation of building 500 in which data processing system 420, having at least a part of the herein described subject matter, may be integrated with a reasonable amount of experimentation.

FIG. 5 depicts an example representation of building 500 in which data processing system 420, having the device 100 connected hereto. The device 100 is controlling the locks of building 500. Examples of such locks are building access locks and vault locks.

Figure 6A:
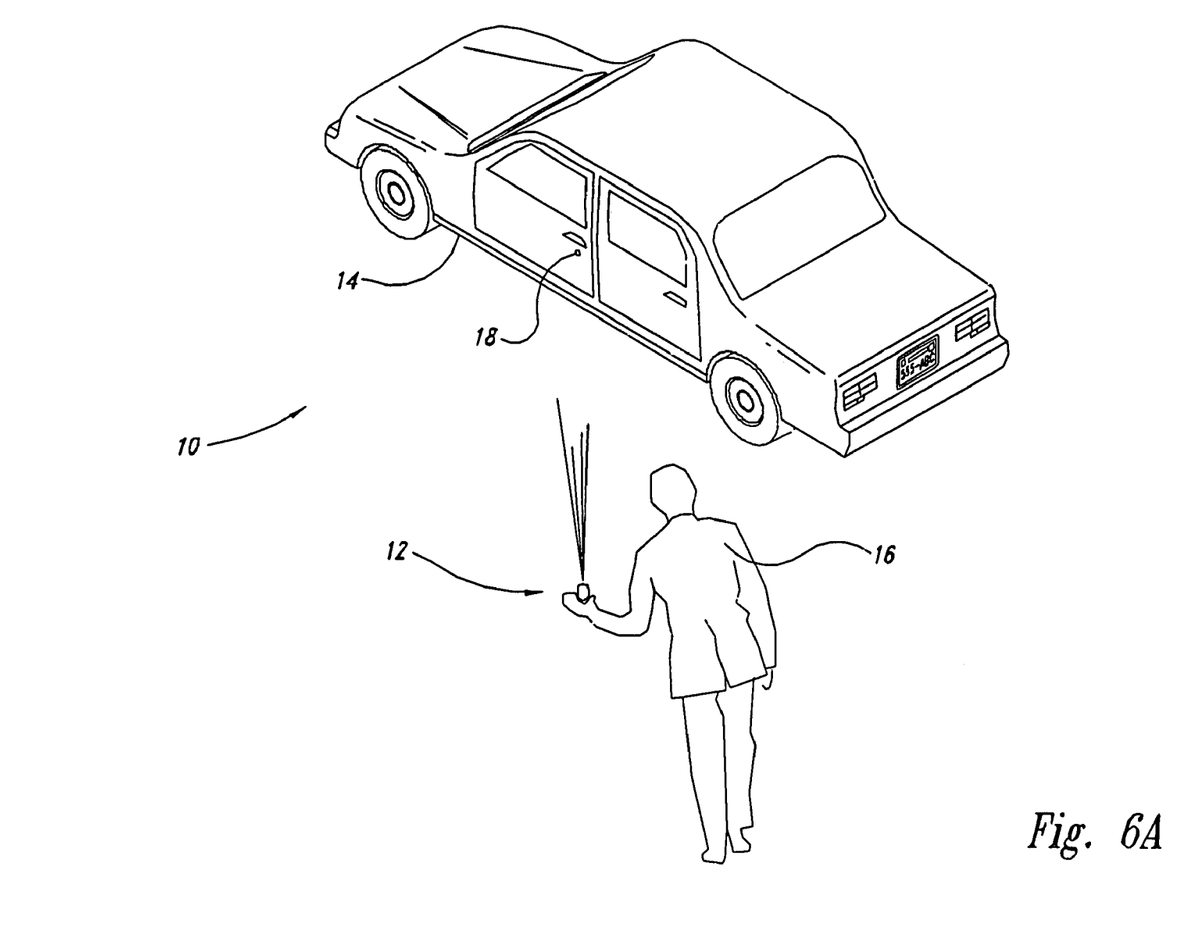
FIGS. 6A and 6B depict examples of vehicles having the herein described device incorporated.

FIG. 6A illustrates another example 10 in which device 100 may be used. A remote automobile access device 12, to permit locking or unlocking of the vehicle 14 having locks 18 thereon, may have device 100 incorporated therein. A user 16 would put their finger or thumb thereon and, after being recognized as an authorized user, be permitted to input commands into the automobile 14, such as "lock the doors," "unlock the doors," and other commands. Such a device is explained in more detail in copending U.S. application Ser. No. 09/475,686 incorporated herein by reference.

Figure 6B:
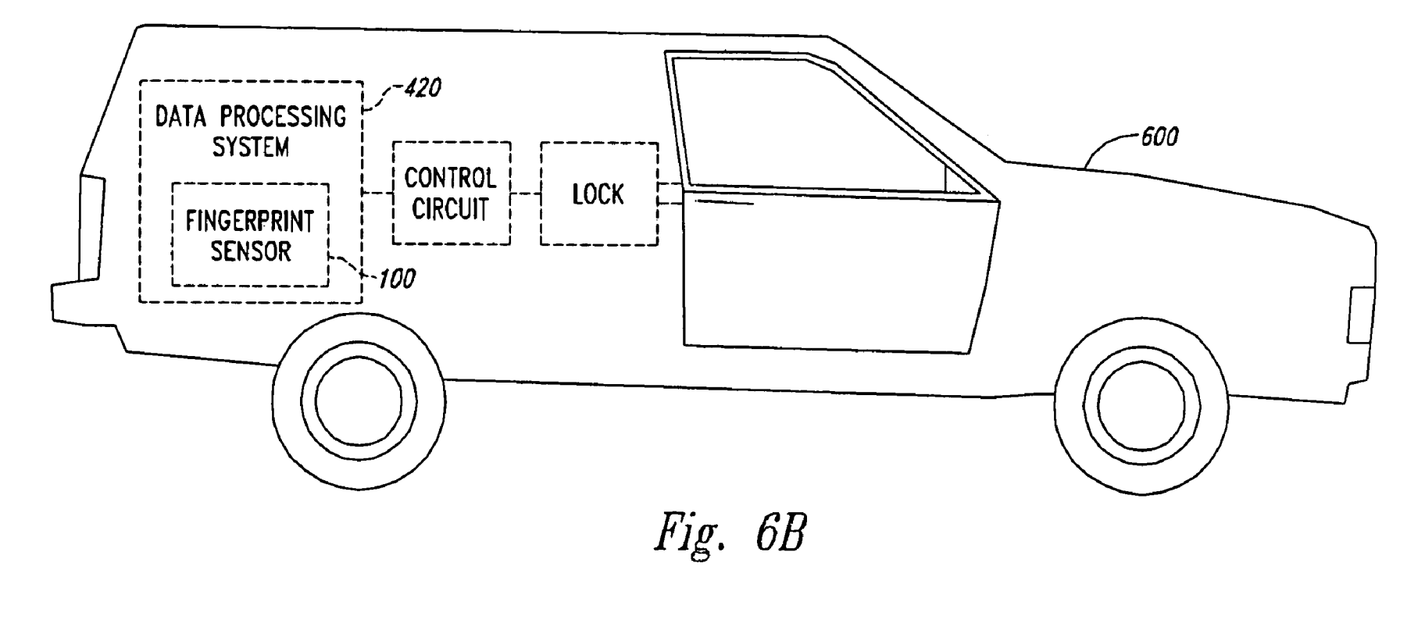

FIG. 6B depicts a vehicle 600 having data processing system 420, wherein device 100 is integrated, is controlling the locks of vehicle 600 (in other implementations (not shown), device 100 is used to control access to the electronic systems of vehicle 600). Examples of vehicle 600 include cars, trucks, planes, and boats. Access to other items could also be controlled, such as firearms, including handguns and rifles.

While the foregoing discussion has shown device 100, integrated with data processing system 420, controlling data processing systems, locks, electronics, firing pins, etc., those having ordinary skill in the art will appreciate that in other applications device 100 controls such devices directly.

The foregoing described embodiments depict different components contained within, or connected with, different other components. It is to be understood that such depicted architectures are merely exemplary, and that many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality.

While particular embodiments of the present invention have been shown and described, it will be obvious to those skilled in the art that, based upon the teachings herein, changes and modifications may be made without departing from this invention and its broader aspects and, therefore, the appended claims are to encompass within their scope all such changes and modifications as are within the scope of this invention. For example, in some implementations, device 100 forms part of a data processing system 420 which controls access to a communication device, such as a wireless or hardwired communication device. Furthermore, it is to be understood that the invention is solely defined by the appended claims. It will be understood by those within the art that, in general, terms used herein, and especially in the appended claims are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present.

What is claimed is:

1. A device comprising:
   a first integrated circuit affixed to a substrate;
   an electronic circuit component affixed to the substrate;
   a first encapsulation structure encasing said first integrated circuit;
   a second integrated circuit affixed to said first encapsulation structure; and
   a second encapsulation structure which fully encases said first encapsulation structure and said electronic component and at least partially encases said second integrated circuit.

2. The device of claim 1, further comprising:
   at least one groove in at least one surface of said first encapsulation structure and a conductive adhesive in said at least one groove, said second integrated circuit in contact with the conductive adhesive.

3. The device of claim 2, further comprising:
   at least one electrical grounding structure in electrical contact with the conductive adhesive.

4. A device comprising:
   a first integrated circuit affixed to a substrate;
   a first encapsulation structure encasing said first integrated circuit;

a second integrated circuit affixed to said first encapsulation structure, the second circuit being a fingerprint-sensor integrated circuit and having a top surface exposed; and a second encapsulation structure which least partially encases said first encapsulation structure and at least partially encases said second integrated circuit, leaving a top surface exposed of the second integrated circuit.

5. The device of claim 1, wherein said second integrated circuit comprises:

a smart card integrated circuit frilly encased by said second encapsulation structure.

6. A device comprising:

a printed circuit board;

a first integrated circuit coupled to said printed circuit board and encased in a first encapsulation structure;

a second integrated circuit affixed to the first encapsulation structure; and a second encapsulation structure which fully encases the first encapsulation structure at least partially encases the said second integrated circuit.

7. The device of claim 6, wherein said second integrated circuit affixed to the first encapsulation structure comprises:

said second integrated circuit in contact with a conductive adhesive in at least one pre-formed groove of the first encapsulation structure.

8. The device of claim 7, further comprising:

at least one electrical grounding structure in electrical contact with the conductive adhesive.

9. The device according to claim 6, wherein:

the second encapsulation structure fully encapsulates the first integrated circuit and the first encapsulation structure.

10. The device according to claim 6 wherein said substrate is a printed circuit board and, further including:

the printed circuit board to which the first integrated circuit is affixed, being electrically connected to the first integrated circuit;

electrical connections between the second integrated circuit and said printed circuit board; and electrically conductive paths in the printed circuit board that electrically connect a plurality of electrical signal paths on the first integrated circuit to a plurality of electrical signal paths on the second integrated circuit.

11. The device of claim 6, further comprising:

a data processing system operably coupled with the second integrated circuit.

12. The device of claim 6, further comprising:

a building operably coupled with the second integrated circuit.

13. The device of claim 6, further comprising:

a vehicle operably coupled with the second integrated circuit.

14. The device of claim 6, further including:

an electrical component that is fully encapsulated by the second encapsulation structure and is spaced from the first encapsulation structure.

15. A method comprising:

attaching the first integrated circuit to a first substrate;

forming a first encapsulation structure encasing a first integrated circuit on a first substrate;

connecting a second integrated circuit to the first encapsulation structure; and forming a second encapsulation structure fully encasing the first encapsulation structure and at least partially encasing the second integrated circuit.

16. The method of claim 15, comprising:

forming at least one groove in at least one surface of the first encapsulation structure.

17. The method of claim 15, wherein said connecting the second integrated circuit to the first encapsulation structure comprises:

depositing a conductive adhesive in at least one groove of the first encapsulation structure.

18. The method of claim 15, comprising:

electrically connecting at least one of the first and second integrated circuits to ground.

19. A method comprising:

forming a first encapsulation structure encasing a first integrated circuit on a first substrate;

connecting a second integrated circuit to the first encapsulation structure, the second integrated structure being a fingerprint-sensor integrated circuit;

forming a second encapsulation structure at least partially encapsulating the first encapsulation structure and the second integrated circuit.

20. A method comprising:

forming a first encapsulation structure encasing a first integrated circuit on a first substrate;

connecting a second integrated circuit to the first encapsulation structure, the second integrated structure being a smart card integrated circuit;

forming a second encapsulation structure at least partially encapsulating the first encapsulation structure and the second integrated circuit.

* * * * *